(12) United States Patent
Li (10) Patent No.: US 9,583,306 B2
(45) Date of Patent: Feb. 28, 2017

(54) SWING OBJECTIVE LENS

(71) Applicant: Hermes Microvision Inc., Hsinchu (TW)

(72) Inventor: Shuai Li, Fremont, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 14/964,274

(22) Filed: Dec. 9, 2015

(65) Prior Publication Data

US 2016/0172150 A1    Jun. 16, 2016

Related U.S. Application Data

(60) Provisional application No. 62/089,547, filed on Dec. 9, 2014.

(51) Int. Cl.
*G21K 5/04* (2006.01)
*H01J 37/10* (2006.01)
(Continued)

(52) U.S. Cl.
CPC .......... *H01J 37/1478* (2013.01); *H01J 37/145* (2013.01); *H01J 37/21* (2013.01); *H01J 37/28* (2013.01); *H01J 2237/063* (2013.01); *H01J 2237/1035* (2013.01); *H01J 2237/12* (2013.01); *H01J 2237/14* (2013.01); *H01J 2237/1508* (2013.01); *H01J 2237/2801* (2013.01)

(58) Field of Classification Search
USPC ........................ 250/396 R, 397, 398, 396 ML
See application file for complete search history.

(56) References Cited

U.S. PATENT DOCUMENTS 6,392,231 B1 * 5/2002 Chen .................. H01J 37/141
250/310
6,452,175 B1    9/2002 Adamec
(Continued)

FOREIGN PATENT DOCUMENTS

EP         2378537        10/2011
JP      1999-067130        3/1999

OTHER PUBLICATIONS

X. Liu, X. Zhang, Y. Zhao, A. Desai, and Z. W. Chen, "Low energy large scan field electron beam column for wafer inspection", Received Jun. 4, 2004; accepted Oct. 12, 2004; published Dec. 14, 2004), p. 3534-3538, American Vacuum Society.

*Primary Examiner* — Nicole Ippolito
(74) *Attorney, Agent, or Firm* — WPAT, PC; Justin King (57) ABSTRACT

A scanning electron microscope (SEM) with a swing objective lens (SOL) reduces the off-aberrations to enhance the image resolution, and extends the e-beam scanning angle. The scanning electron microscope comprises a charged particle source, an accelerating electrode, and a swing objective lens system including a pre-deflection unit, a swing deflection unit and an objective lens, all of them are rotationally symmetric with respect to an optical axis. The upper inner-face of the swing deflection unit is tilted an angle θ to the outer of the SEM and its lower inner-face is parallel to the optical axis. A distribution for a first and second focusing field of the swing objective lens is provided to limit the off-aberrations and can be performed by a single swing deflection unit. Preferably, the two focusing fields are overlapped by each other at least 80 percent.

17 Claims, 9 Drawing Sheets

(51) Int. Cl.
*H01J 37/147* (2006.01)
*H01J 37/28* (2006.01)
*H01J 37/145* (2006.01)
*H01J 37/21* (2006.01)

(56) References Cited

U.S. PATENT DOCUMENTS

| | | |
|---|---|---|
| 6,534,766 B2 | 3/2003 | Abe et al. |
| 6,627,890 B2 | 9/2003 | Lanio |
| 6,717,144 B2 | 4/2004 | Kimura et al. |
| 6,747,279 B2 | 6/2004 | Adamec |
| 6,825,475 B2 | 11/2004 | Petrov et al. |
| 6,956,211 B2 | 10/2005 | Sato et al. |
| 6,960,766 B2 * | 11/2005 | Chen ............... H01J 37/141 250/396 ML |
| 7,112,803 B2 | 9/2006 | Petrov et al. |
| 7,282,722 B2 | 10/2007 | Sato et al. |
| 7,531,799 B2 | 5/2009 | Kawasaki et al. |
| 2013/0277554 A1 * | 10/2013 | Ren ............... H01J 37/261 250/310 |
| 2015/0060662 A1 * | 3/2015 | Chen ............... H01J 37/145 250/307 |

* cited by examiner

SWING OBJECTIVE LENS

CLAIM OF PRIORITY

This application claims the benefit of priority of U.S. provisional application No. 62/089,547 entitled to inventor Shuai Li, filed Dec. 9, 2014 and entitled "Swing Objective Lens System for Tilting Electron Beam", the entire disclosures of which are incorporated herein by reference.

FIELD OF THE INVENTION

The invention relates to swing objective lens. The invention also relates to a method for tilting an electron beam. However, it would be recognized that the invention has a much broader range of applicability.

BACKGROUND OF THE INVENTION

The following description and examples are not admitted to be prior art by virtue of their inclusion in this section.

Undoubtedly, compared to any other technology or knowledge, semiconductor devices not only impact nowadays society but also influence our daily life. Although it can be traced to two centuries ago, for example Alessandro Volta in 18th century and Michael Faraday in $19^{th}$ century, the history of semiconductor development indeed influences mankind in commercial semiconductor devices is $20^{th}$ century. In the first, vacuum tube transistor is replaced by the semiconductor devices which mainly include BJT (Bipolar Junction Transistor) and MOSFET (Metal-Oxide-Semiconductor Field Effect Transistor), and then the semiconductor devices are minimized into integrated circuits. No matter digital logic circuit device, analog circuit device or communication devices, these semiconductor devices can be fabricated on silicon-based substrate or semiconductor compound substrate. Another semiconductor devices are photoelectronic devices which mostly include LED (Light Emitting Diode), LD (LASER Diode) or photovoltaic cell base on photoelectric effect. Currently, digital electronic devices based on MOSFET fabricated in silicon substrate are commercially the most significant, and the applications of the devices are processors and memory devices.

Fabrication processes for manufacturing ICs in the silicon substrate include cleaning process, oxidation and thermal process, ion-implementation process, thin film deposition, lithography, etching process and CMP (Chemical Mechanical Polishing) process. By the combination of the above processes, when all electronic devices are formed in the substrate, and then followed by metallization process to electric connect all electronic devices, a specific application device, such as CPU, ASIC, FPGA, DRAM, or Flash, can be produced. With the technology progress of semiconductor process, the smaller width of an electronic device followed by Moore's law which means transistors are doubled every 24 months, the more devices in one wafer can be fabricated to cost down.

The semiconductor fabrication processes include ion implantation process, thermal process, thin film deposition process, etching process, CMP (Chemical Mechanical Polishing) process, lithography, and cleaning process. And they will be briefed hereinafter.

Ion-implantation process will direct group III or group V atoms implanted into silicon substrate to alter local electric conductivity such that some regions are positive conductivity and some regions are negative conductivity. Phosphorus or Arsenic atoms are usually used for the negative conductivity, while Boron atom is usually used for the positive conductivity.

Thermal process provides formation of thermal oxide layer and annealing for drive-in after ion-implantation. In the present art, RTP (Rapid Thermal Process) is popular instead of conventional thermal process in furnace. It includes RTO (Rapid Thermal Oxidation) and RTA (Rapid Thermal Annealing) to respectively form silicon oxide and repair lattice damages after ion-implantation such that single crystal structure can be recovered and dopant can be activated.

Thin film deposition process includes PVD (Physical Vapor phase Deposition) and CVD (Chemical Vapor phase Deposition) to form several to several tens thin film layers with variant materials and thicknesses on silicon substrate. Metal layers, formed on a substrate, always provide electric interconnections among devices, while dielectric layer provides isolation between metal layers. Chemical reactions in vapor phase, happened to form thin films in CVD, include MOCVD (Metal-Organic CVD), APCVD (Atmosphere Pressure CVD), LPCVD (Low Pressure CVD), HPCVD (Hybrid Physical CVD), RTCVD (Rapid Thermal CVD), HDPCVD (High Density Plasma CVD), and PECVD (Plasma Enhanced CVD). Thin films forms by CVD usually include silicon oxide, silicon nitride, polysil icon, metal tungsten, metal aluminum, and metal titanium nitride. Metal target are heated or bombarded in vacuum such that atoms on the metal target can be transferred to substrate surface to form thin film in PVD, which includes evaporation and sputtering. Metal thin films, such as aluminum, titanium, or alloy thereof, are always formed by using PVD. Quality control of the thin film is critical to IC process, so thin film process must be monitored throughout the procedure to reflect abnormal, such that thickness uniformity and defect and be avoided.

Etching process, which includes wet etch and dry etch, is to remove material. In the semiconductor process, patterns on a reticle can be transferred to a thin film by using etch process. Wet etching is isotropic by reacting etchant to selective material, and etched profile always reveals bowl-like shape. Dry etch is popular and anisotropic by reacting plasma in an external electric field with the selective material, and etched profile will reveal vertical-like shape.

CMP is another method to remove material, which introduce slurry between publish pad and wafer with chemical and mechanical reactions to achieve whole wafer planation, such that thin films in the following process can be formed better. Silicon oxide layer, metal layer and polysilicon layer are most applied in the CMP process.

Lithography process, also named photo-lithography process, is the most critical in the semiconductor process, which includes PR (photo Resist) layer coating, soft bake, exposure, development, hard bake, and ash after etching process. The PR can be selectively removed through exposure and development, and circuit patterns can be transferred to a specific material. When the semiconductor process continues shrinking, available RET (Resolution Enhancement technology), such as OPC (Optical Proximity Correction), immersion lithography, and EUV (Extreme Ultraviolet lithography), are applied.

Cleaning process must be processed after all other process recited above to avoid uninvited particles or residues to impact device quality, which includes rinsing wafer by DI (De-Ionized) water and drying the wafer. Ultrasonic agitation can be applied in the cleaning process. This process will clean out all pollutions, such as particles, organic matter, inorganic matter, metal ions.

Defects are inevitably generated in the semiconductor process, which will greatly impact device performance, even failure. Device yield is thus impacted and cost is raised. Current defects can be classified into systematic defects and random defects in general. On the one hand, system defects infer defects will be found repeatedly and systematically in wafers, in which defect patterns can be used as reference in classification to determine root cause of which process incurs such defects. In order to increase semiconductor process yield, it is critical to enhance yield by monitoring, such as by using SEM (Scanning Electron Microscope), systematic defects highly appeared regions in mass production process to real time eliminate systematic defects. On the other hand, the non-systematic defects, random particle defects, are random residues left in wafers. Distributions and characteristic profiles are important references to distinguish systematic defects from non-systematic defects.

More specifically, systematic defects can be classified as reticle errors in alignment or machine offset, process mistakes incurred by recipes or materials, prober damages in wafer probing, scratches on wafer surface, and wafer edge effect of topography incurred from non-uniformity of PR coating or thermal stress.

The corresponding defects are recited hereinafter in brief. Defects incurred in lithographic process include PR residue defects due to PR deteriorated or impurity, peeling defects, bridge defects, bubble defects, and dummy pattern missing defects due to pattern shift. Defects incurred in etching process include etching residue defects, over-etching defects and open circuit defect. Defects incurred in CMP process include slurry residue defects, dishing defects and erosion defects due to variant polishing rates, scratched due to polishing. Further, when process nodes continue shrinking, new materials and processes will be introduced to inevitably incur new type defects. For example, because physical dimension of patterns are smaller than the optical resolution of the applied lithographic wavelength of 193 nm, the critical dimension exposed on wafers may incur offset. Thinning defects are another inevitably incurred in the process node shrinking. In order to reduce RC delay in multi-layered interconnection structures, low-k dielectric layer and cupper material are introduced. Cupper can't be etched and hence damascene process is introduced that metal is filled into dielectric layer. Therefore, some other hidden defects are covered under layer, such as void defects, etching residue defects, over-etching defect, under layer particles, and via open incurred in the interconnection process. Such hidden, crucial defects are too hard to be analyzed and eliminated.

For the non-systematic defects are mainly random particles defect incurred from particles in air randomly fallen on the wafer, which are not easy to be identified and resolved.

In order to enhance semiconductor process yield, defects have to be identified as soon as possible to prevent from impact pouring out. Optical microscope is used in conventional optical inspection which includes bright field inspection and dark field inspection. Every die on a wafer is scanned by optical beam and images of every die are generated and stored. A die-to-die compare is used to identify if there is any abnormal or defect with locations and images thereof.

When semiconductor nodes continue shrinking, dimensions of defect shrink also. Unimportant small defects in previous now become critical therefore. It is a challenge to identify such small defects by using conventional optical inspection tool and a new tool is necessary. One method is to combine the operations of optical inspection and review SEM. Because of resolution, the optical inspection is not enough to meet requirement of identifying defects, but a suspect region in blurred images can be determined defect-like and reviewed by review SEM with high resolution. Thus defects can be identified and analyzed. Another method is to illuminate dual beams on a wafer surface to obtain interference patterns, and defect regions always have different interference pattern to that of the normal region. Thus, defects can be identified and further analyzed by review SEM. In practice, defects must be identified first and locations of the defects are forward to review SEM with high resolution to analyze defects.

However, in sub-20 nanometer semiconductor node, optical inspection tool can't reveal any pattern more, even by using interference method, and hence SEM is the only way to identify defects. Nevertheless, due to the detected signal electrons in the SEM are secondary electrons, detection duration inevitably retrogrades significantly compared to that of optical inspection. Hence, it is an important issue to fast identify defects on a wafer by using SEM. An e-beam inspection tool, based on SEM, is currently best solution for defect inspection.

The e-beam inspection tool is to find or identify defects in the semiconductor process, and relative to review SEM, a large FOV (Field-of-View) and large beam current are commercial means to enhance inspection throughput. In order to obtain large FOV, a SORIL (Swing Objective Retarding Immersion Lens) system is applied commercially. Moreover, resolution is sometimes lowered, compared to review SEM, enough to capture defects.

The e-beam inspection tool is designed different from the review SEM. The review SEM is designed to known, identified defects or suspects of defect, so scan duration is long enough to analyze or review defects, and hence it can't process inspection. On the other hand, the e-beam inspection tool, with high scanning rate than the review SEM and high resolution than the optical inspection tool, can identify defects that the optical inspection tool in no way to capture.

Furthermore, in lithographic process, some particular patterns may have great possibility to incur defects, but won't incur them each time. The defects generated by these particular patterns even can't be modified through recipe tuning or modifying reticle directly. Such a kind of patterns is named hot spot, and must be monitored in-line process.

Applications of SEM, except yield management tool of e-beam inspection and analysis tool of review SEM, may further be metrology tool in semiconductor manufacturing process; that is CD (critical Dimension)-SEM. CD-SEM will measure CD in a wafer with by line-scanning sample with moving stage to reveal process uniformity. Moreover, in order to obtain exact dimension, resolution is very critical, and thus low beam current must be applied.

Still another application of SEM is EBDW (E-Beam Direct Writer), or named EPL (E-beam Projection Lithography), still based on SEM. Purposes of EBDW are to expose a photoresist directly, and an etching step can be applied to transfer patterns to a sample after the photoresist is developed. In such a process, there is no reticle necessary, and patterns are written directly on the sample. Because wavelength of an e-beam is superior small than an optical wavelength, finer patterns, such as nano scale resolution, can be easily obtained.

Nowadays semiconductor process node continues shrinking, a protruding gate structure of FinFET is provided. In order to manage yield of this kind of semiconductor device, side surface the gate is critical and has to be inspected. Large tilting angle inspection is thus necessary.

BRIEF SUMMARY OF THE INVENTION

The object of this invention is to provide a SOL with large tilting angle for inspecting a stereo structure. A stereo image can be obtained.

Accordingly, the invention provides a system for tilting a charged particle beam focused by an immersion objective lens, which comprises a pre-lens deflector above and adjacent to a magnetic field generated by the immersion objective lens, and a swing deflector located inside said immersion objective lens. The pre-lens deflector deflects the charged particle beam to a pre-determined angle, and the swing deflector swings a magnetic lens generated by the immersion objective lens into the pre-determined angle, such that the charged particle beam is focused by the swung magnetic lens and bombards a specimen with the pre-determined angle.

The charged particle beam can be an electron beam.

The invention therefore provides a swing objective lens, which comprises an immersion objective lens for focusing a charged particle beam on a specimen, a pre-lens deflector above and adjacent to a magnetic lens generated by the immersion objective lens, and a swing deflector located inside said magnetic lens and providing an electrostatic field with a first condition. The pre-lens deflecting the charged particle beam to a pre-determined angle. When the first condition matches a second condition generated by the immersion objective lens and the swing deflector, the magnetic lens is swung into the pre-determined angle.

The first condition is $[\phi''(z)+\frac{1}{2}\phi'''(z)(z-z_0)]$, and $\phi$ is an electric potential produced by the swing deflector. The second condition is $\sqrt{\phi(z)}[B(z)+\frac{1}{2}B'(z)(z-z_0)]$, and B is the magnetic field generated by the immersion objective lens. The match can be the first condition mostly overlapped with the second condition. In a preferred embodiment, the match can be a first peak value of the first condition close to a second peak value of the second condition. In a most preferred embodiment, the match can be a first distribution of the first condition similar and close to a second distribution of the second condition.

The invention therefore provides a swing objective lens, which comprises an immersion objective lens for focusing a charged particle beam on a specimen, a pre-lens deflector above and adjacent to a magnetic lens generated by the immersion objective lens, and a swing deflector located inside said magnetic lens. The charged particle beam is along an optical axis. The pre-lens deflecting the charged particle beam to a pre-determined angle. A first portion of an inner surface of the swing deflector has an inclined angle to the optical axis and a second portion of the inner surface of the swing deflector being parallel to the optical axis, wherein the magnetic lens is swung by the swing deflector into the pre-determined angle.

The swing deflector generates an electric potential $\phi$ with a first condition, $[(\phi'(z)+\frac{1}{2}\phi''(z)(z-z_0)]$. The immersion objective lens generates a magnetic field B with a second condition, $\sqrt{\phi(z)}[B(z)+\frac{1}{2}B'(z)(z-z_0)]$. The first condition matches the second condition. In a preferred embodiment, the match is a first distribution of the first condition similar and close to a second distribution of the second condition. The swing objective lens may further comprise a scanning deflector unit for scanning the charged particle beam on the specimen. The swing objective lens may further comprise a retard electrode below the immersion objective lens.

The present invention also provides a scanning electron microscope, which comprises an electron source for providing an electron beam along an optical axis, a condenser lens for condensing the electron beam, a swing objective lens, and a detector for receiving signal electrons emanating from the specimen.

The present invention also provides a method for tilting a charged particle beam, which comprises steps of deflecting the charged particle beam to a pre-determined angle, providing an immersion magnetic lens to the charged particle beam such that the charged particle beam is focused on a specimen, and providing a swinging electrostatic field to the immersion magnetic lens such that the immersion magnetic lens is swung to the pre-determined angle, wherein the swing electric field has a first condition match to a second condition generated by the immersion magnetic lens and the swinging electrostatic field.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Further advantages of the present invention may become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE REFERENCE TERMS

An optical axis (or common axis) in the present invention is a central axis extending from the gun tip to the stage in a rotational symmetry electron optical system.

A swing deflector unit in the present invention is a deflector, which is located in a retarding field of a compound objective lens of an electron optical system, used to swing a complex field of the compound objective lens (i.e., generating a swing field).

A paraxial aberration in the present invention is an aberration which is occurred in the area away from an optical axis, and usually is induced when an electron beam is deflected by a lens.

An electrostatic lens in the present invention is an electro-optical lens formed by at least one electrode to focus and deflect an electron beam.

A magnetic lens in the present invention is an electro-optical lens formed by a coil or a coil surrounded with a yoke to focus and deflect an electron beam.

A large field of view (LFOV) in the present invention is a large object region to be scanned by an electron beam, which can result in a scan speed 144 times faster than the conventional one.

A swing objective lens (SOL) in the present invention is a lens near the specimen, which can be swung by a swing deflector unit, for focusing and deflecting an electron beam.

Landing energy (LE) in the present invention is an incident energy of a charged particle beam for a specimen, which can be changed by a potential different in an electro-optical tool.

DETAILED DESCRIPTION OF THE INVENTION

As used herein, the term "specimen" generally refers to a wafer or any other specimen on which defects of interest (DOI) may be located. Although the terms "specimen" and "wafer" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

The wafer may further include at least a portion of an integrated circuit (IC), a thin-film head die, a micro-electromechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

Turning now to the drawings, it is noted that the figures are not drawn to scale. In particular, the scale of some of the elements of the figures is greatly exaggerated to emphasize characteristics of the elements. It is also noted that the figures are not drawn to tie same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of an apparatus, column or a device such as a lens", while "radial" means "in a direction perpendicular to the optical axis".

The present invention relates to an improved focusing and deflection system of an e-beam inspection tool, in particular to a Swing objective lens (SOL), for instance, a Swing Objective Retarding Immersion Lens (SORIL). Therein, the improved system can generate readily a compensation field to achieve a low paraxial aberration and a large scanning field.

In order to enhance the semiconductor product yield, it is needed for the observation and examination of the IC patterned on the wafer and defects occurred in the semiconductor fabrication processes. With the aggressive device scaling in modern IC technology, especially in 65 nm technology node below, the high aspect ratio (HAR) multilevels nanostructure is widely configured on the wafer. Therefore, there are appeared some latent defects that are difficult to be reviewed by conventional optical inspection tools. Moreover, when the technology node comes to the 22 nm below, the optical inspection tool is almost incapable of examining the nanostructures. It is consequence that the SEM is the tool to achieve the above demands.

To further improve the speed of the observation and examination through SEM, except the above-mentioned combination of the inspection SEM and the review SEM, it also has to increase the inspection tool throughput. One of the solutions is the development of SEM for scanning the larger specimen region, namely a large field of view (LFOV) of SEM.

Moreover, the low-voltage e-beam (less than 5 KeV) scan is the industry trend. It has been known that a highly energized e-beam is used in SEM to improve the spatial resolution, but causes damage to specimens, even causes undesirable charging of the specimen. Therefore, a SEM providing a low-energy e-beam scan (i.e., LVSEM), which decelerates the high-energy e-beam by a retarding field closed to the specimen, can avoid the reliability problem due to the damage of the specimen.

The low-aberration and LFOV scan of SEM has an objective lens system including a focusing subsystem, and a deflection subsystem. Types of the objective lens system are Moving Objective Lens (MOL), Variable Axis Lens (VAL), Variable Axis Immersion Lens (VAIL), Swing Objective Lens (SOL), and Swing Objective Retarding Immersion Lens (SORIL), etc. Compared to the conventional SEM, which the deflection angle ranges from 1° to 5°, the SEM with the larger scanning region has greater tilted scan angle. As a result, the off-axis aberration becomes more severe.

In summary, it is a critical index for an e-beam inspection tool to provide with a high-quality (high-resolution, low-aberration) images and a high throughput. However, the deteriorated off-axis aberration problem has to be solved.

Figure 1:
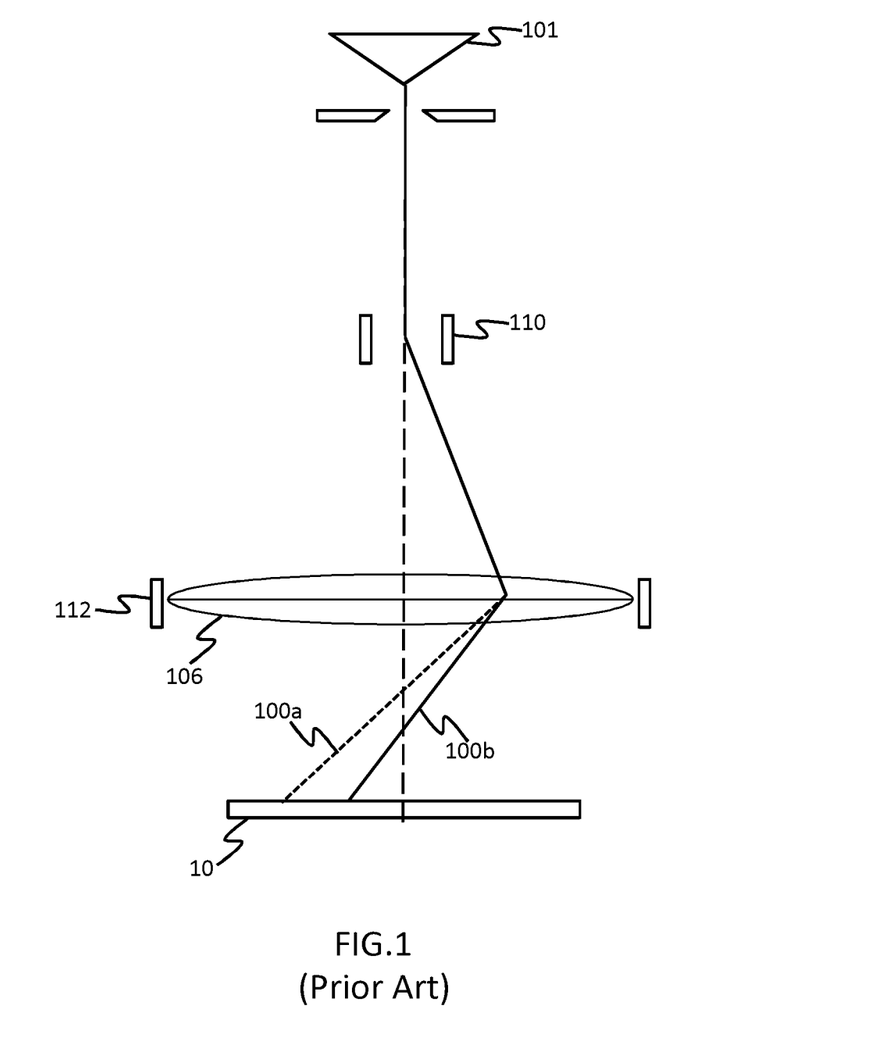
FIG. 1 is a diagram illustrating a conventional scanning electron microscope (SEM) with a deflection correction device to correct the off-aberrations.

In order to reduce the paraxial aberration, many prior arts have put efforts into it. For example, U.S. Pat. Nos. 6,627,890, 7,531,799 and E.P. Pat. No. 2,378,537 have reported that an aberration correction device arranged in the objective lens is employed to correct the aberration due to the deflected e-beam, which maintains the high resolution. However, the aberration corrector generally forms by multi-electric pole plates or multi-magnetic pole plates, which have complex settings and need a complicated and high level power source to supply voltages to the electric or magnetic plates. Please refer to FIG. 1, which illustrates the embodiment of U.S. Pat. No. 6,627,890. An e-beam is emitted from an electron source 101, then is deflected by a deflector 110, and enters an objective lens 106. An orbit 100a of the e-beam is corrected by the deflection collector 112 to an orbit 100b during the objective lens 106 for lowering the off-aberration, and hits a specimen 10. Additional examples of the deflection collection devices are illustrated in U.S. Pat. Nos. 6,956,211 and 7,282,722 to Hitachi, Ltd., which disclose a system with a plurality of aberration correction lenses to compensate the aberrations from an objective lens system. However, the arrangements of the collectors are complicated. In short, the above prior arts disclosed the deflection collection devices are used to generate a compensation field and correct the off-axis aberrations of e-beam produced as the e-beam passes through an objective lens system.

In the theory, in order to generate a LFOV lens such as a SOL, the e-beam motion has to satisfy a trajectory equation (1), as shown in the following. However, the serious off-axis aberrations usually exist for it is hard to satisfy the equation (1). It's known that the equation (1) is determined by the focusing field, the deflection field and the e-beam trajectory in common, and is expressed as the following (by Y. Zhao and A. Khursheed, J. Vac. Sci. Technol. B 17, 2795 (1999)):

$$\omega'' + \frac{\varphi'}{2\varphi}\omega' + \frac{\varphi''}{4\varphi} - i\sqrt{\frac{\eta}{2\varphi}}\left(B\omega' + \frac{1}{2}B'\omega\right) = -\frac{VE_1}{2\varphi} + \sqrt{\frac{\eta}{2\varphi}}ID_1 \quad (1)$$

wherein $\omega=x+iy$ represents a radial deflection distance from Z-axis, (x, y) is the image plane, B and $\varphi'$ represent magnetic focusing field and electric focusing field, respectively, $E_1$ and $D_1$ represent the first order differential functions of electric and magnetic deflection filed, respectively, V and I represent the complex deflection voltage and current, respectively, and $\eta$ is charge to mass ratio. The equation (1), which ignores the high order differential terms, is a first order approximation equation. Corresponding to different objective lens systems, the radial deflection distance from Z-axis $\omega$ would express in different forms. For example, $\omega$ is a real constant in MOL, and it is related to the slope of the e-beam trajectory in SOL.

Figure 2:
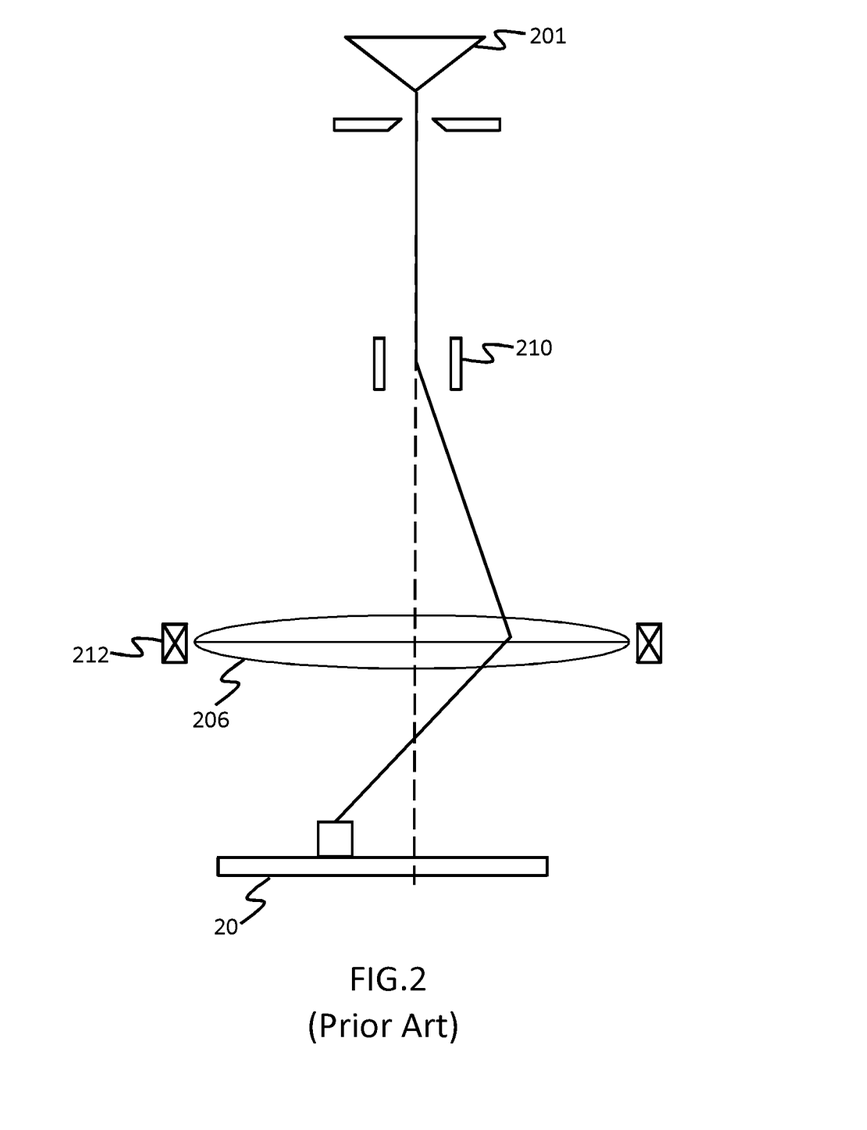
FIG. 2 is a diagram illustrating another conventional scanning electron microscope (SEM) with a compensation device and a movable stage to correct the off-aberrations.

Due to the first order differential term exists, the distribution of the focusing field, a compound field of electric and magnetic field, is a non-linear function. In order to satisfy the equation (1), $D_1$ and $E_1$ in the right hand side have to give a non-linear field distribution corresponding to a magnetic field determined by B and B', and an electric field determined by $\varphi$ and $\varphi'$ in the left hand side, respectively. However, because of the non-linear property, it is quite difficult to perform the distribution by deflectors and the objective lens in practical. In the present, there are two mainly concepts used to overwhelm the difficulty due to non-linear distribution. One is that the first order deflection field is separated to a linear field and a non-linear field, and the linear field is performed by a corresponding device and meanwhile the non-linear field is limited to be ignorable. For example, U.S. Pat. No. 6,717,144, which is illustrated in FIG. 2, disclosed a method of limiting the titled angle in a small range, so as to ignore the non-linear effect, and a compensation deflector 212 is arranged to compensate the aberration due to a rotation field, and a shift field is compensated by moving the stage 20, while an e-beam from an electron source 201 enters a deflector 210 and an objective lens 206. Therefore, the first order field distribution from the equation (1) can be readily satisfied by the objective lens field and the two compensation devices in common, without non-linear field distribution. The other keeps the adjustment of the parameters of the equation (1) until it is satisfied or approximately satisfied, namely, finding the optimum solution. For instance, U.S. Pat. No. 6,392,231 disclosed the parameter to be adjusted, which is the radial deflection distance $\omega$. However, in general, the optimum value is difficult to find, and when the e-beam kinetic energy is changed, the optimum value is greatly impacted so as to the off-aberrations increased.

To sum up, for the compound objective lens of focusing and deflecting field, in particular to SEM with the compound objective lens and the larger scanning field, it is still a big challenge to find a method to efficiently remove the off-axial aberrations.

Accordingly, the present invention has been devised to solve the above-described problems. Specifically, the present invention provides a method to determine a deflection field distribution which can readily remove the off-axis aberrations in a swing objective lens of an electro-optical system. Also, the present invention provides with a modification of the shape and the arrangement of the swing deflection unit to achieve the non-linear distribution of the swing field. It is consequence that a low off-axis aberration, high throughput electro-optical tool is obtained.

A SEM of the present embodiment mainly includes a charged particle source, an accelerating electrode for accelerating an e-beam, an objective lens which is arranged above the stage and in rotational symmetry about an optical axis, for focusing the e-beam on a specimen surface, a decelerating lens formed by a potential different between the specimen and the specimen-side end of the objective lens to decrease an e-beam landing energy (LE), and a deflection units system including at least one deflection unit arranged along the optical axis in the bore of the objective lens for deflecting the e-beam and achieving a scan in a large specimen region. Therein, the objective lens can be an electrostatic lens, a magnetic lens, and a compound lens consisting of magnetic lenses and electric lenses, and at least one of the deflection units, which can be electric or magnetic deflectors, has to be disposed in the decelerating lens.

The method of a determination of the focusing and swing field distribution to approximately satisfy a first-order e-beam trajectory equation of SOL in the present invention is described as following. The equation includes a first focusing field, a second focusing field, and a swing field. Therein, the swing field generated by a swing deflection unit is determined by the combination of the first and second focusing field. In order to make the swing field easily be generated by the swing deflection unit, and meanwhile, match the compound field, the present invention discloses that the compound field has to be limited in a certain range which can be provided by the swing deflection unit. Preferably, the first and second focusing fields are overlapped by each other at least 80 percent. More preferably, each space position of each maximum of the first and second focusing field is closed to each other. The optimum is that both of the focusing fields have similar space distribution patterns of field intensities in the same region. Taking the SOL with a compound lens as an example, a first-order electrostatics filed acting as its first focusing field and a first-order potential-magnetic coupling field acting as its second focusing field, and each maximum of them is located on the specimen or its adjacent area. As a result, their compound field will be separated into two parts; one is beneath the specimen and the other is above the specimen. Therefore, the above-part field is concerned to satisfy the equation (1) and the below-part field can be ignored. In a preferred embodiment, the swing deflection unit is a single deflector without other deflectors.

Regarding to achieve both of the maximums of the first and second field are located on or near the specimen surface, and meanwhile, the above-part field generated by the swing deflection unit can satisfy the equation (1), the present invention discloses a means as the following. The modification of the shape, size and the arrangement of the swing deflection unit are used to satisfy the above-mentioned demand under the fixed objective lens field. In other words, the space distribution of the swing field above the specimen can match the above-part field to satisfy the equation (1).

Accordingly, the present invention provides a distribution which can be readily generated by a swing deflection unit and be satisfied with the first-order e-beam trajectory equation of SOL, by modifying a shape and an arrangement of a swing deflection unit.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

Figure 3A:
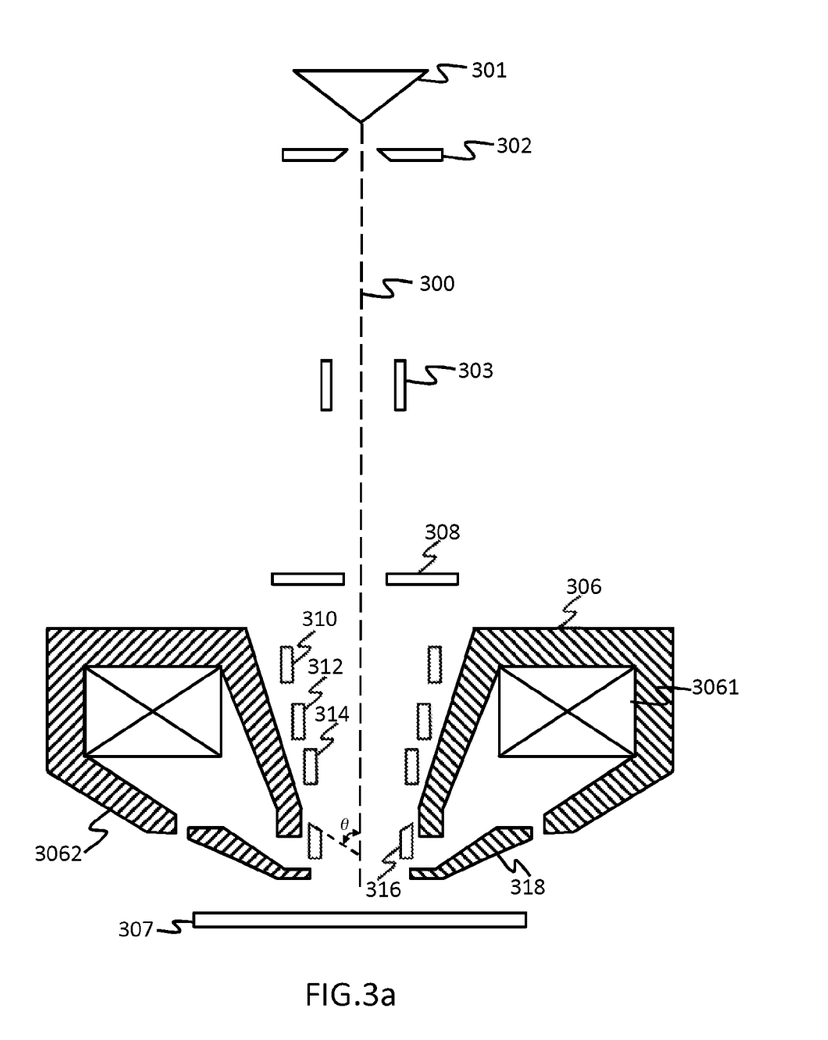
FIG. 3a is a diagram of the first embodiment in the present invention, which illustrates a SORIL SEM.

Please refer to FIG. 3a, it is a first embodiment of the present invention, which illustrates a SEM including a charged particle source 301, an accelerating electrode 302, a condenser lens 303 and a swing objective retarding immersion lens (SORIL) column. The column comprises four electrostatic deflectors 310, 312, 314 and 316, a magnetic immersion lens 306 including a coil 3061 surrounded by a high magnetic permeability yoke 3062 (including a pole piece), which immerses a specimen 307 by its magnetic field, and a decelerating lens (i.e., a retarding electrode) 318 with a rotational symmetry about an optical axis 300, which is arranged between a specimen-side end of the objective lens 306 and the specimen 307. Therein, said four deflectors are separated into a first deflection group of deflectors 310 and 316 for deflecting an e-beam and swinging an objective lens field, and a second deflection group of deflectors 312 and 314 for scanning the specimen 307. For the first deflection deflector, the deflector 310 is an in-lens pre-deflector disposed in the bore of the objective lens 306 to generate a deflection field for deflecting the e-beam, and a swing deflector 316 disposed near a gap of the yoke 3062 to provide a swing field for swinging the objective lens field and limiting the off-aberrations at the same time. In a preferred embodiment, each of all said electrodes is an annular deflector including 12 electrode-plates, and each of the plates is connected to a variable voltage driver, such that the e-beam is controlled to be deflected in X and Y directions. The gap of the yoke 3062 is poisoned near the specimen-side end of the objective lens 306, and the objective lens magnetic flux leakages from it. In the present embodiment, the SORIL system has a short working distance so as to gain the high resolution for the reduction of the space charged effect.

In the operation of the above SEM configuration, a high voltage (~12 KeV) is applied to the emitter 301 to emanate the high kinetic energy e-beam. While the e-beam enters the SORIL, the pre-deflector 310 is used to deflect the e-beam to a pre-determined direction, and then, the deflected e-beam is focused and retarded by the objective lens 306 and retarding electrode 318 respectively before hitting the specimen 307. Therein, the retardation in the e-beam can avoid the damage to the specimen 307 by such a high energy e-beam. In the example, the swing deflector 316, which is arranged in the retarding field, has a greater effect on the limitation of the off-aberrations than other deflectors do, because it acts on the decelerated e-beam and is much closed to the specimen 307. That makes it possible to limit the off-aberrations by swing deflectors, even by one deflector as shown in the present invention. The first deflection group of deflectors 310 and 316 can position the e-beam and move the e-beam in a large deflection distance (larger than 600 μm). And the second deflection group of deflectors 31 and 314 moves the e-beam in a small region to rapidly scan the specimen 307. By the two groups, the SORIL scan can be accomplished. After that, the secondary electrons (SE) and the back-scattered electrons (BSE) are emanated from the specimen 307 and received by a detector 308 to convert the electronic signal into the image data. Moreover, the large beam current is employed herein to improve the throughput, for the reduction of the e-beam residence time on the specimen.

As to establish the SORIL, the following electron trajectory equation (2) has to be satisfied:

$$-VE_1 = k[\phi'(z) + \tfrac{1}{2}\phi''(z)(z-z_0)] - i\sqrt{2\phi(z)\eta}k \\ [B(z) + \tfrac{1}{2}B'(z)(z-z_0)] \quad (2)$$

wherein $V = V_x + iV_y$ represents the voltage of the swing deflector 312, $E_1$ represents the swing field, $B(z)$ and $\phi(z)$ represent the magnetic and electric field distribution along Z-axis, respectively, $B'(z)$ and $\phi'(z)$ denote the first order differentiation with respect to z, $\eta$ is the charge-to-mass ratio, $z_0$ is the position of objective plane, k is the slope of the swing optical axis. Therein, the first-order approximate electric field $[\phi'(z) + \tfrac{1}{2}\phi''(z)(z-z_0)]$ is a first focusing field and the first-order approximate coupling field $\sqrt{\phi(z)}[B(z) + \tfrac{1}{2}B'(z)(z-z_0)]$ is a second focusing field.

From equation (2), the deflection field $E_1$ on its left hand side, is the superimposition of $\sqrt{\phi(z)}[B(z) + \tfrac{1}{2}B'(z)(z-z_0)]$ and $[\phi+(z) + \tfrac{1}{2}\phi''(z)(z-z_0)]$. In general, both of the electric and magnetic swing deflectors are used to provide a compound field for making the two sides of the equation (2) be equal. In other words, the elimination of the off-aberrations from SORIL is performed by at least two deflectors.

Moreover, in order to reduce the structure and product complexity, the present invention provides a SOL system which only needs one swing deflector to satisfy the equation (2) and meanwhile, the off-aberrations are limited. A simple and easy way to be generated field distribution is given to satisfy the equation (2) through a single swing deflector. However, the above distribution is not achievable as the superimposition field is an irregular distribution.

Figure 3B:
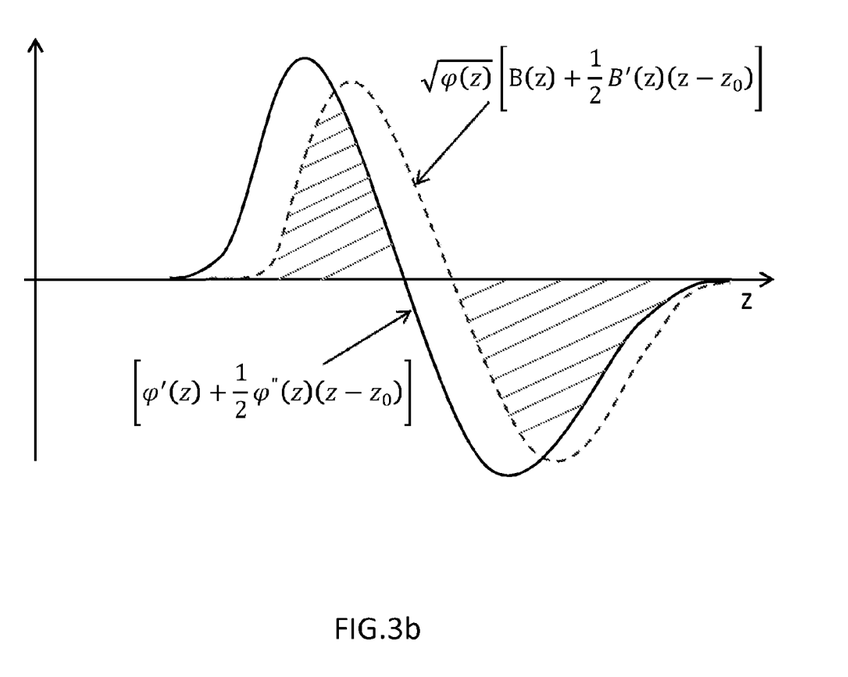
FIG. 3b is a distribution of a first and second focusing field in the present invention, in which the two focusing fields are overlapped by each other at least 80 percent.
Figure 3C:
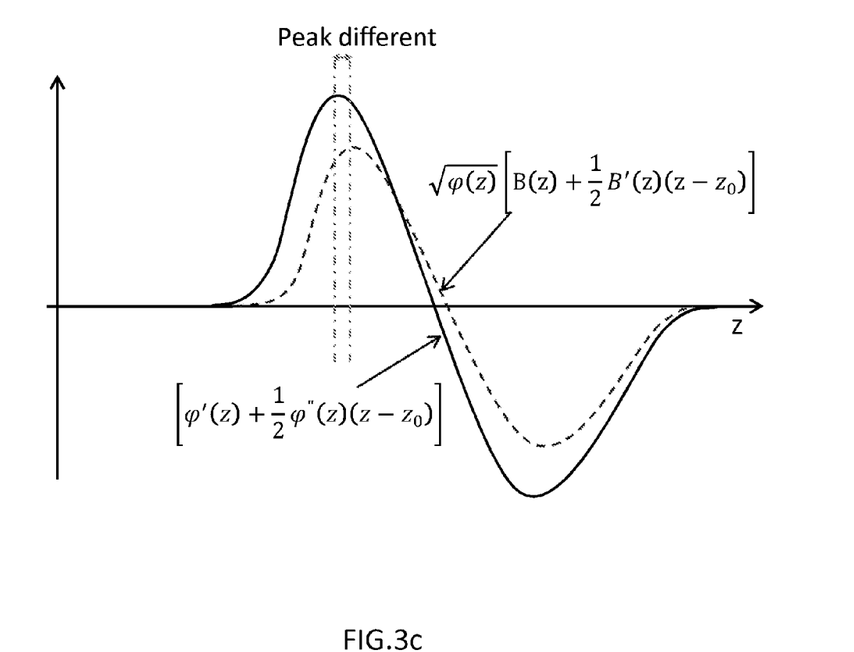
FIG. 3c is a distribution of a first and second focusing field in the present invention, in which each space position of each maximum of the first and second focusing field is closed to each other.
Figure 3D:
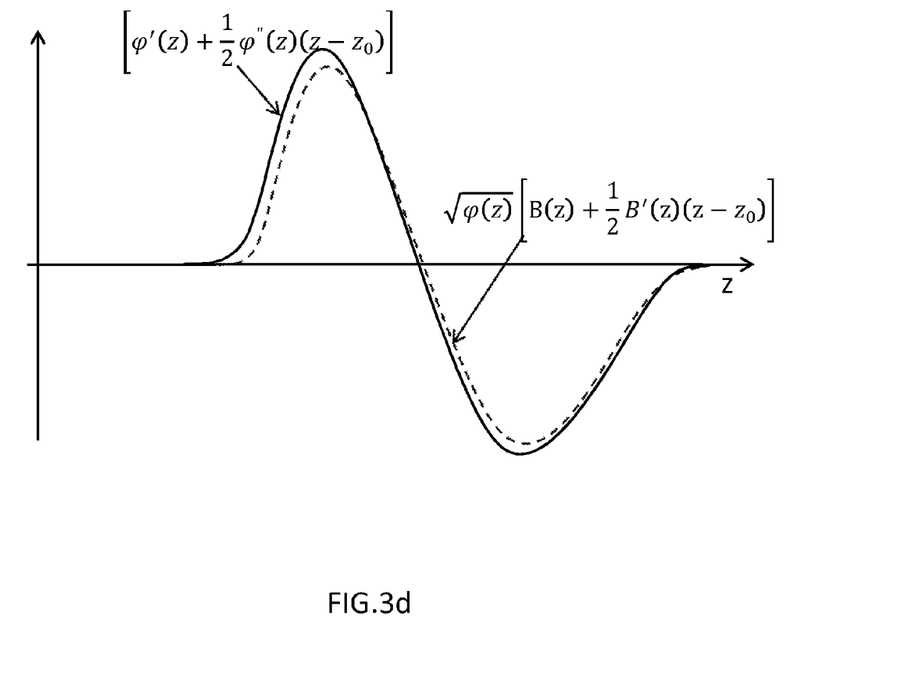
FIG. 3d is a distribution of a first and second focusing field in the present invention, in which both of the focusing fields have similar space distribution patterns of field intensities in the same region.
Figure 3E:
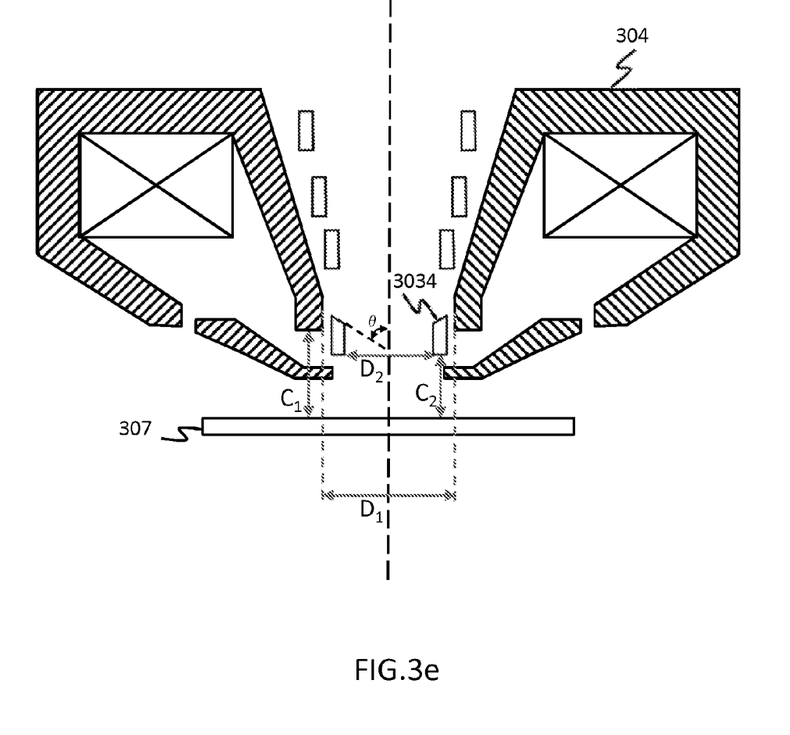
FIG. 3e is a diagram illustrates the shape, size and the arrangement of the swing deflector and magnetic lens, which are used to be modified to accomplish SORIL.

Please refer to FIG. 3b, a preferred distribution is provided by the embodiment in accordance with the present invention. The two focusing fields are overlapped by each other at least 80%, as shown in the hatch area of FIG. 3b. In this case, the superimposition field distribution of the two focusing fields can form an approximate smooth curve with a single peak and two sides of the peak are strictly monotonic curves. More preferably, each maximum of the first and second focusing field is closed to each other at the space position, as shown in FIG. 3c. The optimum is that both of the focusing fields have similar space distribution patterns of field intensities in the same region, and meanwhile, their maximums are located on the specimen or its adjacent area, as shown in FIG. 3b. As a result, in the optimum case, only single swing deflector is needed to generate a swing field which can limit the SORIL off-aberrations. Therein, the two focusing fields can match with each other, as the described in the optimum case, by satisfying the following equation (3):

$$[\phi'(z)+\tfrac{1}{2}\phi''(z)(z-z_0)]=\sqrt{\phi(z)}[B(z)+\tfrac{1}{2}B'(z)(z-z_0)] \quad (3)$$

wherein $\phi'(z)$ represents the electric field distribution along Z-axis, which is determined by the swing deflector 312. While the two sides of the equation (3) are equal, it is easy to satisfy the equation (2). Please refer to FIG. 3e, the modification of the shape, size and the arrangement of the swing deflector 316 and of the position of the magnetic lens 306 are used to accomplish SORIL under the fixed current and voltage supplied to the compound lens of B(z) and $\phi'(z)$ in equation (2). B(z), which is leaked from the magnetic lens 306, can be determined by the adjustment of the distance, $C_i$, between an inner pole piece of the magnetic lens and a specimen 307, and of the bore size, $D_1$, of the inner pole piece. On the other hands, the modification of the distance, $C_2$, between the swing deflector 316 and the specimen 307, and the bore size, $D_2$, of the swing deflector 316, and of the shape of the swing deflector 316 are used to provide a swing filed which can match the compound field. Therein, the shape of the swing deflector can be that its upper inner-face is tilted an angle to the outer of the SEM to form a deviation deflector. In the case, the scanning angle of the e-beam is also extended from 1 to 15 degrees.

Figure 3F:
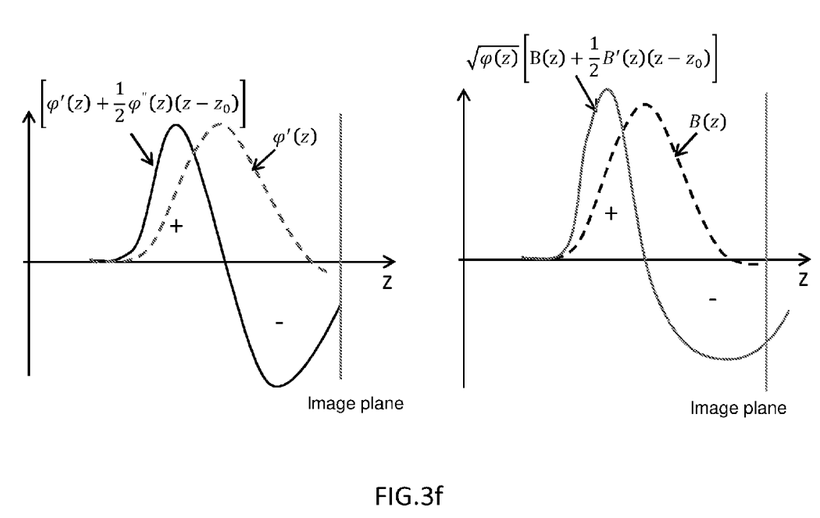
FIG. 3f is a diagram illustrates the distribution, which changes from positive to negative, of a first and second focusing field above a specimen.

In another aspect, the swing deflector 316 is not limited to a single deflector in the present embodiment. As the distribution position of the maximum of B(z) and/or $\phi'(z)$ is not limited on the adjacent area of the specimen surface, their compound field distribution would become more complicated, so as to require more than one swing deflector to satisfy the equation (2). For example, referring to FIG. 3f, the distributions of two focusing fields change from positive to negative above the specimen surface (i e , image plane), and only one deflector cannot provide the non-single peak distribution, so that more than one deflectors are required to satisfy the distributions.

Figure 4:
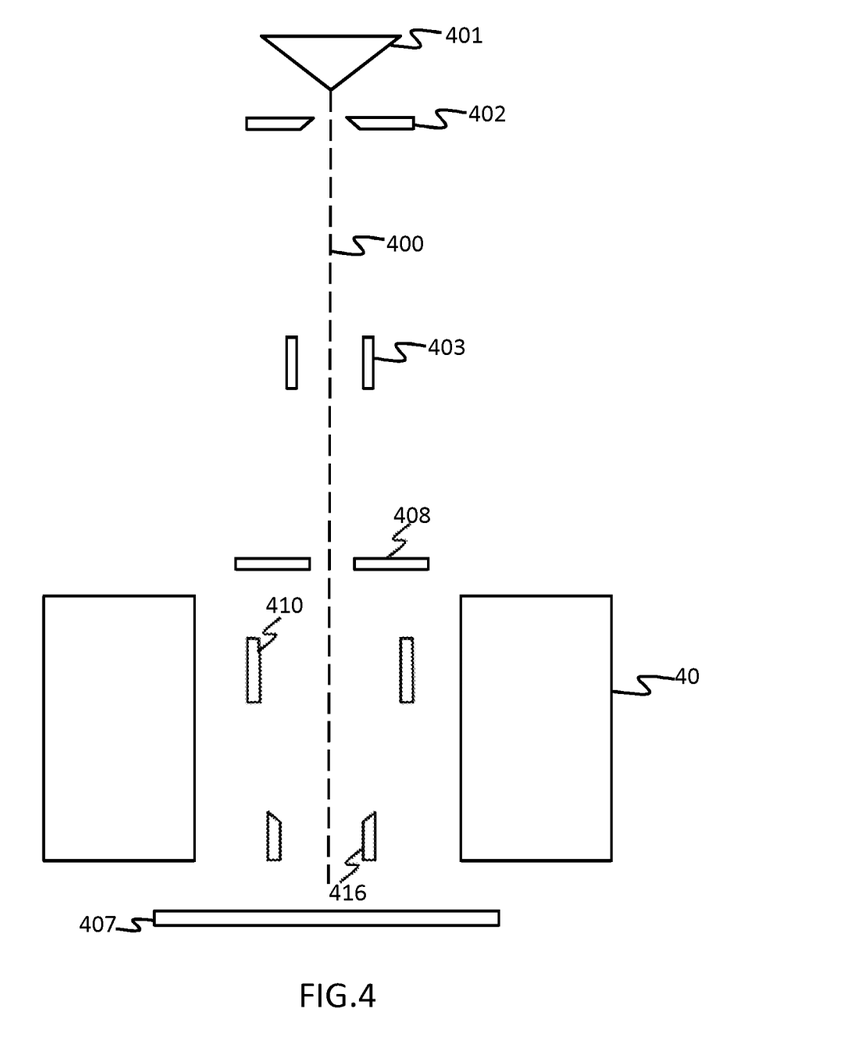
FIG. 4 is a diagram of the second embodiment in the present invention, which illustrates a SOL SEM.

A second embodiment of the present invention is illustrated in FIG. 4, which discloses a SEM comprises a charged particle source 401, an accelerating electrode 402, a pre-condenser lens 403, a detector 408, and a swing objective lens system including a pre-deflection units 410, a swing deflection units 416, and an objective lens 406, all of them are rotationally symmetric arrangement with respect to an optical axis 400. Therein, the objective lens 406 can be a coil, an electrode, or a coil surrounding by a yoke. Preferably, the objective lens 406 provides an immersion field to the specimen 407.

Accordingly, the distributions of B(z) and $\phi'(z)$ of the equation (2) follow that of the first embodiment and satisfy the equation (3), so as to use only one swing deflection unit to achieve a swing objective lens. And referring to the first embodiment, the swing field of the swing deflection units 416, which matches the distributions of B(z) and $\phi'(z)$, can be obtained by adjusting the following parameters: firstly, the distance between an inner pole piece of the objective lens 406 and a specimen 407, and the bore size of the inner pole piece, and then, the distance between the specimen-side end of the swing deflection units 416 and a specimen 407, and the bore size of the swing deflection units 416, and finally, the shape of the swing deflection unit 416, which is that its upper inner-face is tilted an angle θ to the outer of the SEM and a lower inner-face parallel to the optical axis 400.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The following description presents the main features difference between the present invention and the prior arts. The first prior art, Low energy large scan field electron beam column for wafer inspection (by Liu et al.), and the second prior art, U.S. Pat. No. 6,392,231, provide a SORIL system, which have an immersion objective lens, five deflectors, one of them is located below the objective lens, and a retarding lens arranged near the specimen. The equation (1) is used herein to establish a SORIL. The third prior art, U.S. Pat. No. 6,627,890, disclosed a multi-poles correction device arranged under the objective lens to correct the off-aberrations. The fourth prior art, E.P. Pat. No. 2,378,537, provided an aberration correction device, which included an optical correction device and a movable charged particle beam tilting device, arranged in the objective lens to correct the objective lens aberration by controlling the beam aperture angle. The fifth prior art, U.S. Pat. No. 6,534,766, to Toshiba Ltd. and Topcon Ltd. disclose a deflector arranged under the objective lens to compensate the aberrations. However, its working distance is too long to further improve the space resolution. The sixth to ninth prior arts, U.S. Pat. Nos. 6,452,175, 6,825,475, 6,380,546, and U.S. Pat. No. 7,112,803, to Applied Materials Ltd. provide a first deflector disposed below a non-immersion objective lens, which was thin to get a short working distance, in common with a second deflector for compensating the aberrations. The tenth prior art, U.S. Pat. No. 6,747,279, discloses a mixed configuration of an objective lens and a deflector so that the working distance would not increase for higher resolution.

According to the above-mentioned recitations, the main difference between the present invention and the prior arts is that the superimposition field distribution of the first and the second focusing fields in the objective lens can be provided by only one swing deflection unit. Therein, preferably, the first and second focusing fields are overlapped by each other at least 80 percent. More preferably, each space position of each maximum of the first and second focusing field is closed to each other. The optimum is that both of the focusing fields have similar space distribution patterns of field intensities in the same region. And the means to achieve the demand is that upper inner-face of the swing deflection unit is tilted at an angle θ to the outer of the SEM and its lower inner-face is parallel to the optical axis. The third to tenth prior arts do not define the shape of the swing deflector and ignore the first-order field terms in SOL equation. The first and second prior arts have considered the first-order field terms. However, they do not design the shape of the swing deflection unit. Therefore, the present invention cannot be taught by the above prior arts.

What is claimed is:

1. A system for tilting a charged particle beam focused by an immersion objective lens, comprising:
   a pre-lens deflector above and adjacent to a magnetic field generated by the immersion objective lens, said pre-lens deflector deflecting the charged particle beam to a pre-determined angle; and
   a swing deflector, located inside said immersion objective lens, for swinging a magnetic lens generated by the immersion objective lens into the pre-determined angle, such that the charged particle beam is focused by the swung magnetic lens and bombards a specimen with the pre-determined angle.

2. The system according to claim 1, wherein the charged particle beam is an electron beam.

3. A swing objective lens, comprising:
   an immersion objective lens for focusing a charged particle beam on a specimen;
   a pre-lens deflector above and adjacent to a magnetic lens generated by the immersion objective lens, said pre-lens deflecting the charged particle beam to a pre-determined angle; and
   a swing deflector, located inside said magnetic lens, providing an electrostatic field with a first condition;
   wherein when the first condition matches a second condition generated by the immersion objective lens and the swing deflector, the magnetic lens is swung into the pre-determined angle.

4. The swing objective lens according to claim 3, wherein the first condition is $[\phi'(z)+\frac{1}{2}\phi''(z)(z-z_0)]$, and $\phi$ is an electric potential produced by the swing deflector.

5. The swing objective lens according to claim 4, wherein the second condition is $\sqrt{\phi(z)}[B(z)+\frac{1}{2}B'(z)(z-z_0)]$, and B is the magnetic field generated by the immersion objective lens.

6. The swing objective lens according to claim 5, wherein the match is the first condition mostly overlapped with the second condition.

7. The swing objective lens according to claim 5, wherein the match is a first peak value of the first condition close to a second peak value of the second condition.

8. The swing objective lens according to claim 5, wherein the match is a first distribution of the first condition similar and close to a second distribution of the second condition.

9. A swing objective lens, comprising:
   an immersion objective lens for focusing a charged particle beam on a specimen, wherein the charged particle beam along an optical axis;
   a pre-lens deflector above and adjacent to a magnetic lens generated by the immersion objective lens, said pre-lens deflecting the charged particle beam to a pre-determined angle; and
   a swing deflector, located inside said magnetic lens, a first portion of an inner surface of the swing deflector having an inclined angle to the optical axis and a second portion of the inner surface of the swing deflector being parallel to the optical axis, wherein the magnetic lens is swung by the swing deflector into the pre-determined angle.

10. The swing objective lens according to claim 9, wherein the swing deflector generates an electric potential $\phi$ with a first condition, $[\phi'(z)+\frac{1}{2}\phi''(z)(z-z_0)]$.

11. The swing objective lens according to claim 10, wherein the immersion objective lens generates a magnetic field B with a second condition, $\sqrt{\phi(z)}[B(z)+\frac{1}{2}'(z)(z-z_0)]$.

12. The swing objective lens according to claim 11, wherein the first condition matches the second condition.

13. The swing objective lens according to claim 12, wherein the match is a first distribution of the first condition similar and close to a second distribution of the second condition.

14. The swing objective lens according to claim 13, further comprising a scanning deflector unit for scanning the charged particle beam on the specimen.

15. The swing objective lens according to claim 14, further comprising a retard electrode below the immersion objective lens.

16. A scanning electron microscope, comprising:
   an electron source for providing an electron beam along an optical axis;
   a condenser lens for condensing the electron beam;
   a detector for receiving signal electrons emanating from the specimen; and
   a swing objective lens, comprising:
      an immersion objective lens for focusing a charged particle beam on a specimen,
   wherein the charged particle beam along an optical axis, wherein the immersion objective lens generates a magnetic field B with a second condition, $\sqrt{\phi(z)}[B(z)+\frac{1}{2}B'(z)(z-z_0)]$;
   a pre-lens deflector above and adjacent to a magnetic lens generated by the immersion objective lens, said pre-lens deflecting the charged particle beam to a pre-determined angle;
   a swing deflector, located inside said magnetic lens, a first portion of an inner surface of the swing deflector having an inclined angle to the optical axis and a second portion of the inner surface of the swing deflector being parallel to the optical axis, wherein the magnetic lens is swung by the swing deflector into the pre-determined angle, the swing deflector generates an electric potential co with a first condition, $[\phi'(z)+\frac{1}{2}\phi''(z)(z-z_0)]$, and a first distribution of the first condition similar and close to a second distribution of the second condition;
   a scanning deflector unit for scanning the charged particle beam on the specimen.; and
   a retard electrode below the immersion objective lens.

17. A method for tilting a charged particle beam, comprising:
   deflecting the charged particle beam to a pre-determined angle;
   providing an immersion magnetic lens to the charged particle beam such that the charged particle beam is focused on a specimen; and
   providing a swinging electrostatic field to the immersion magnetic lens such that the immersion magnetic lens is swung to the pre-determined angle, wherein the swing electric field has a first condition match to a second condition generated by the immersion magnetic lens and the swinging electrostatic field.

* * * * *